United States Patent
Wu et al.

(10) Patent No.: US 7,419,882 B2
(45) Date of Patent: Sep. 2, 2008

(54) ALIGNMENT MARK AND ALIGNMENT METHOD FOR THE FABRICATION OF TRENCH-CAPACITOR DRAM DEVICES

(75) Inventors: Yuan-Hsun Wu, Tao-Yuan Hsien (TW); An-Hsiung Liu, Tao-Yuan Hsien (TW); Chiang-Lin Shih, Taipei Hsien (TW); Pei-Ing Lee, Chang-Hua Hsien (TW); Hui-Min Mao, Taipei (TW); Lin-Chin Su, Taipei Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 671 days.

(21) Appl. No.: 11/160,683

(22) Filed: Jul. 5, 2005

(65) Prior Publication Data

US 2006/0234440 A1    Oct. 19, 2006

(30) Foreign Application Priority Data

Apr. 19, 2005  (TW) .............................. 94112415 A

(51) Int. Cl.
*H01L 21/20* (2006.01)
(52) U.S. Cl. .................. 438/386; 438/30; 438/401; 438/975; 438/462; 257/283; 257/797
(58) Field of Classification Search .................. 438/30, 438/386, 401, 975, 462, FOR. 435; 257/283, 257/797
See application file for complete search history.

(56) References Cited

U.S. PATENT DOCUMENTS

| | | | | |
|---|---|---|---|---|
| 5,342,792 A | * | 8/1994 | Yonehara | 438/386 |
| 6,440,816 B1 | * | 8/2002 | Farrow et al. | 438/401 |
| 6,541,347 B2 | * | 4/2003 | Tsai et al. | 438/392 |
| 6,682,983 B2 | * | 1/2004 | Shu | 438/386 |
| 6,706,610 B2 | * | 3/2004 | Yoshimura et al. | 438/401 |
| 6,780,775 B2 | * | 8/2004 | Ning | 438/706 |
| 6,916,703 B2 | * | 7/2005 | Chen et al. | 438/243 |
| 6,979,613 B1 | * | 12/2005 | Wu et al. | 438/243 |
| 7,344,954 B2 | * | 3/2008 | Yeh et al. | 438/386 |
| 2002/0066916 A1 | * | 6/2002 | Hsu et al. | 257/301 |
| 2003/0181016 A1 | * | 9/2003 | Shu | 438/392 |
| 2005/0124111 A1 | * | 6/2005 | Huang et al. | 438/241 |
| 2007/0190736 A1 | * | 8/2007 | Liu et al. | 438/386 |

\* cited by examiner

*Primary Examiner*—Matthew S. Smith
*Assistant Examiner*—Ankush k Singal
(74) *Attorney, Agent, or Firm*—Winston Hsu

(57) ABSTRACT

A small-size (w<0.5 micrometers) alignment mark in combination with a "k1 process" is proposed, which is particularly suited for the fabrication of trench-capacitor DRAM devices which requires highly accurate AA-DT alignment. The "k1 process" is utilized to etch away polysilicon studded in the alignment mark trenches and refresh the trench profile prior to AA pattern transferring, thereby improving wafer alignment accuracy and precision.

5 Claims, 9 Drawing Sheets

ALIGNMENT MARK AND ALIGNMENT METHOD FOR THE FABRICATION OF TRENCH-CAPACITOR DRAM DEVICES

BACKGROUND OF INVENTION

1. Field of the Invention

The present invention relates generally to the field of semiconductor fabrication and, more particularly, to an alignment mark and alignment method for the fabrication of trench-capacitor dynamic random access memory (DRAM) devices.

2. Description of the Prior Art

Semiconductor integrated circuits undergo a variety of processing steps during manufacture, such as masking, resist coating, etching, and deposition. In many of these steps, material is overlaid or removed from the existing layer at specific locations in order to form the desired elements of the integrated circuit. Proper alignment of the various process layers is therefore critical. The shrinking dimensions of modern integrated circuits require increasingly stringent overlay alignment accuracy during pattern transfer. If the proper alignment tolerance is not achieved, the result is a device that is defective or has reliability problems.

Reduction type projection printing has been known as an apparatus of projection exposure for transferring a pattern drawn on a reticle to a resist. In reduction type projection printing process, a step and repeat method is used. The step and repeat method refers to a method of transferring a reticle pattern to a resist in which exposure is performed every time a wafer on a two-dimensionally movable x-y stage is moved in any given direction. A beam such as i-line or KrF laser is directed from a light source through a condenser lens to a reticle. The beam which passes through the reticle is projected on a photoresist on a wafer fixed on a wafer x-y stage through a reduction projection lens. Position of the wafer is automatically moved successively in x, y directions by the wafer x-y stage and the wafer is exposed shot-by-shot.

Registration is typically used to measure the accuracy of a process layer alignment performed using an alignment mark. Registration involves comparing the position of a subsequent layer to that of an existing layer by overlaying a distinct pattern on a matching pattern previously formed on the existing layer. The deviation in position of the overlay from the original provides a measure of accuracy of the alignment. Currently available registration structures include box-in-box visual verniers to determine the amount of alignment offset.

Trench-capacitor DRAM or deep-trench (DT) capacitor DRAM devices are known in the art. Typically, a trench-storage capacitor consists of a very-high-aspect-ratio contact-style hole pattern etched into the substrate, a thin storage-node dielectric insulator (capacitor dielectric), a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar (collar oxide) disposed in the upper region of the trench prevents leakage of the signal charge from the storage-node diffusion to the buried-plate diffusion of the capacitor. After forming the trench capacitors, shallow trench isolation (STI) and active area (AA) regions are formed on the substrate between the trench capacitors. At the stage of forming the AA region, a very high accuracy of the AA-DT alignment is required.

SUMMARY OF INVENTION

It is the primary object of the present invention to provide an improved method of fabricating microelectronic device such as trench-capacitor DRAM devices with improved alignment accuracy.

According to the claimed invention, a method of fabricating a microelectronic device is disclosed. The present invention method comprises the steps of:

(1) providing a semiconductor substrate having thereon a device region and an alignment mark region;

(2) simultaneously etching capacitor trenches into the semiconductor substrate within the device region, and forming alignment mark within the alignment mark region, wherein the alignment mark comprises a plurality of trench lines, and each of the trench lines has a width of smaller than 0.5 microns;

(3) fabricating a trench capacitor within each of the capacitor trenches at least comprising depositing polysilicon layer into the capacitor trenches and simultaneously into the trench lines;

(4) forming a first photoresist layer over the semiconductor substrate, the first photoresist layer having an opening that merely exposing the alignment mark region and the alignment mark;

(5) performing a first etching process to etch the polysilicon layer within the exposed trench lines of the alignment mark;

(6) stripping the first photoresist layer;

(7) forming a second photoresist layer over the semiconductor substrate;

(8) performing a wafer alignment process comprising irradiating the alignment mark using an alignment light beam that passes through the second photoresist layer, thereby acquiring wafer alignment information; and (9) performing an exposure process employing a photomask defining avtive area pattern thereon, thereby transferring the avtive area pattern to the second photoresist layer.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
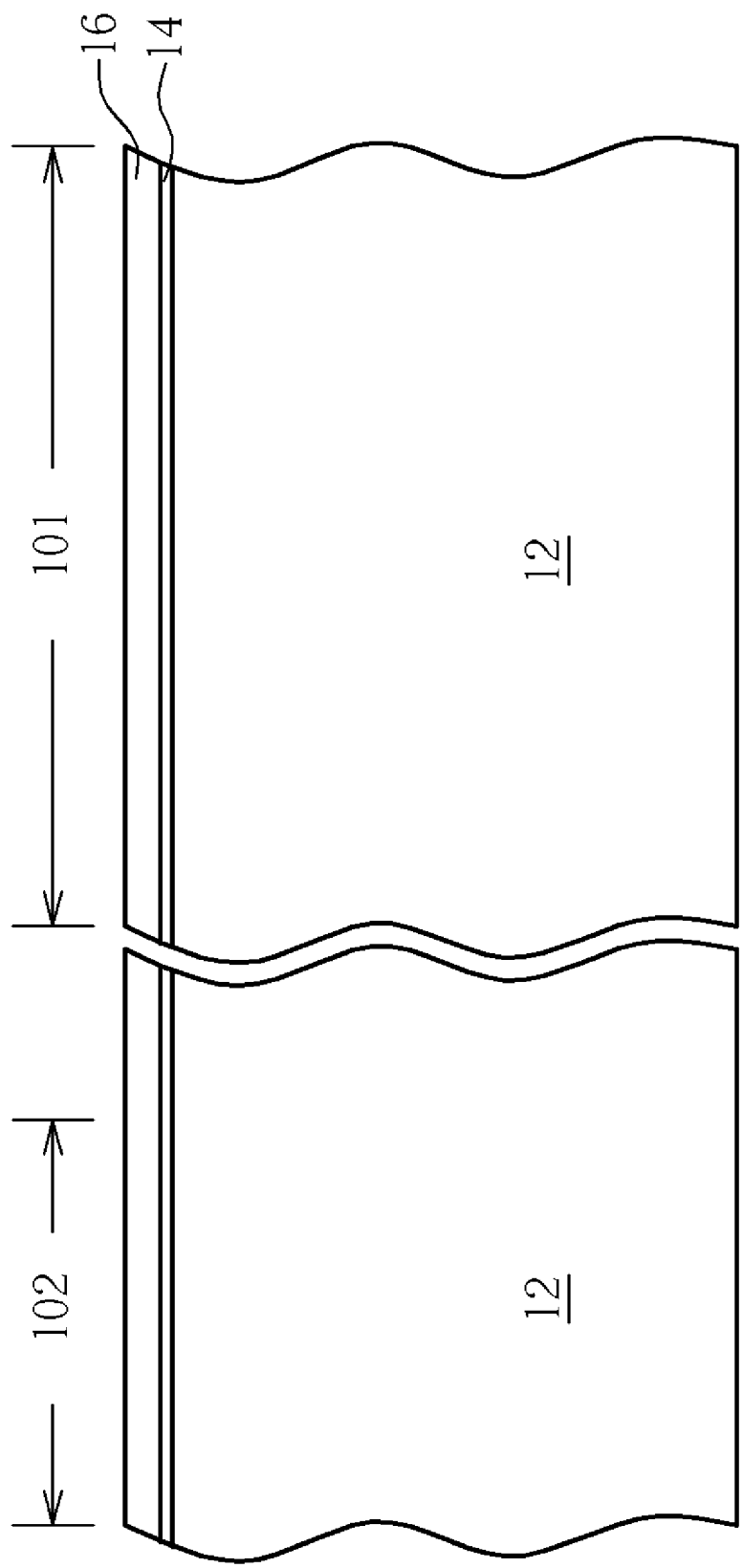
FIGS. 1-7 are schematic, cross-sectional diagrams showing a method of fabricating alignment mark and alignment method for the fabrication of trench-capacitor DRAM devices in accordance with the preferred embodiment of this invention.

The present invention pertains to an alignment mark and alignment method for the fabrication of trench-capacitor DRAM devices. The present invention also addresses a method of reliably forming deep trench capacitor DRAM devices. In describing the preferred embodiment of the present invention, reference will be made herein to FIGS. 1-8 of the drawings. Features of the invention are not drawn to scale in the drawings.

Briefly, the method for fabricating a trench capacitor of a DRAM device can be summarized as follows:

Phase 1: deep trench etching. ("Mask One")
Phase 2: buried plate and capacitor dielectric formation.
Phase 3: first polysilicon deep trench fill and first recess etching.
Phase 4: collar oxide formation.
Phase 5: second polysilicon deposition and second recess etching.
Phase 6: collar oxide wet etching.
Phase 7: third polysilicon deposition and third recess etching.
Phase 8: STI process and active area definition. ("Mask Two"; or "AA mask")

Please refer to FIGS. 1-7. FIGS. 1-7 are schematic, cross-sectional diagrams showing a method of fabricating alignment mark and alignment method for the fabrication of trench-capacitor DRAM devices in accordance with the preferred embodiment of this invention. As shown in FIG. 1, semiconductor substrate 12 has thereon a device region 101 and an alignment mark region 102, in which memory devices and alignment mark are to be formed, respectively. A pad oxide layer 14 and a pad nitride layer 16 are formed on the main surface of the semiconductor substrate 12.

Figure 2:
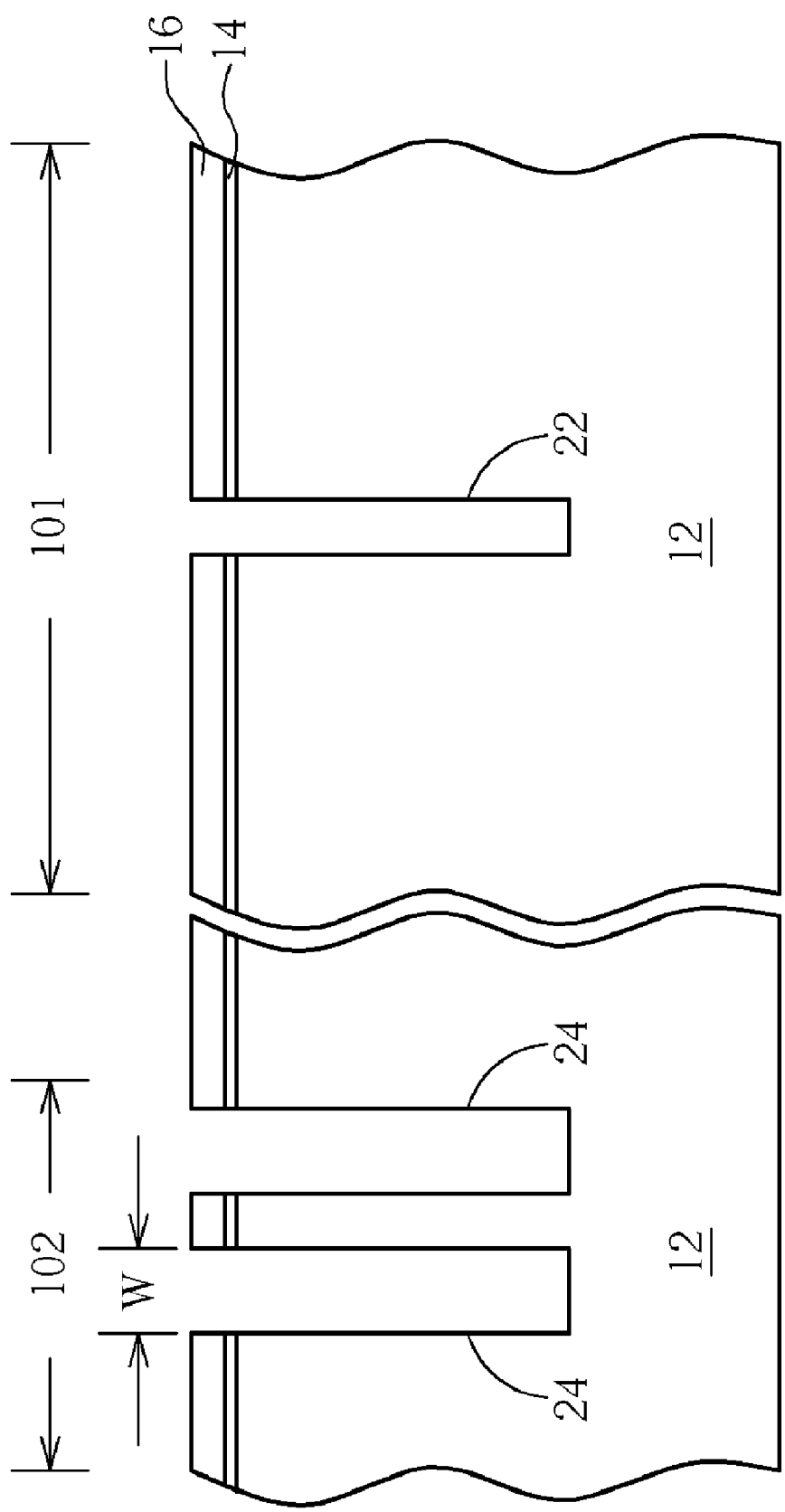
Figure 8:
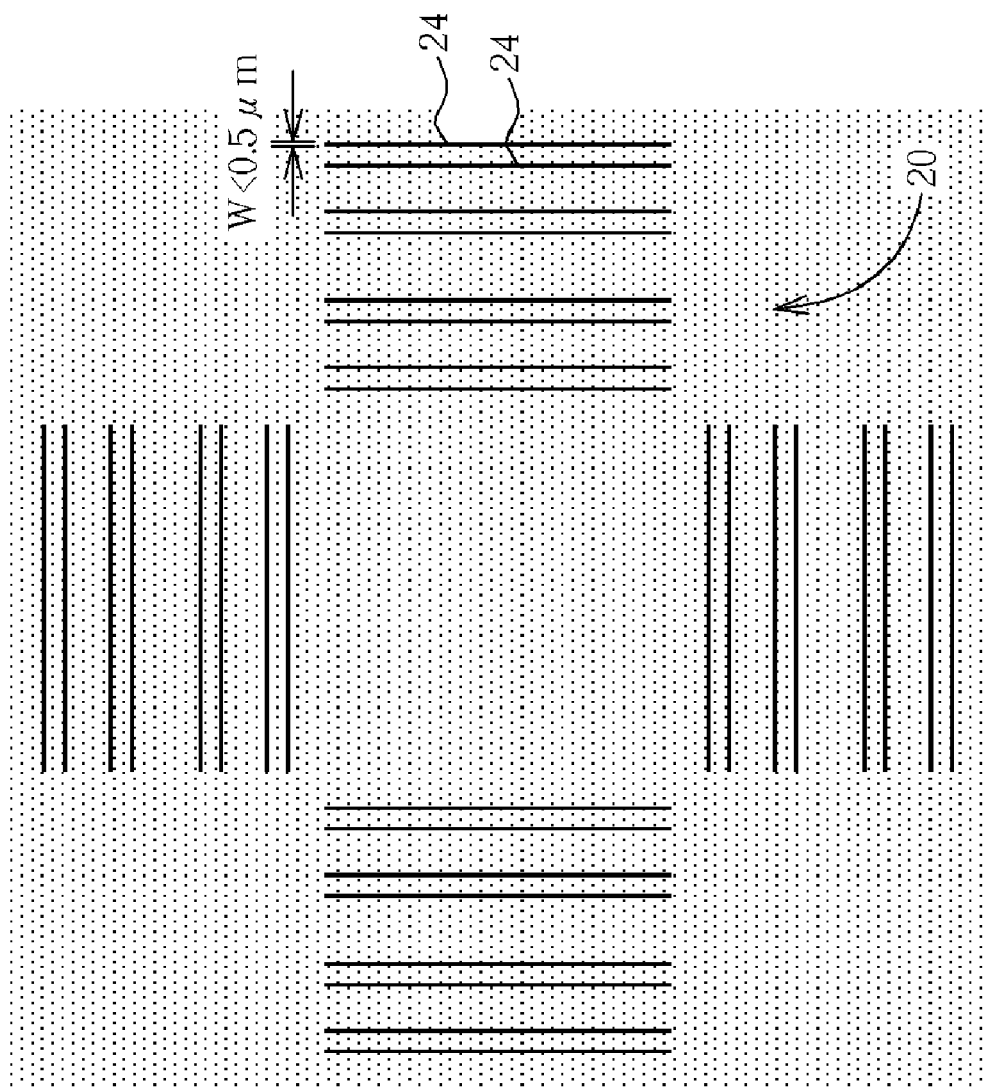
FIG. 8 is a schematic top view of the alignment mark in accordance with the preferred embodiment of this invention.

As shown in FIG. 2, a conventional lithography process (employing "Mask One") and dry etching process are carried out to etch deep trenches 22 and 24 within the device region 101 and within the alignment region 102, respectively, into the pad nitride layer 16, the pad oxide layer 14 and the semiconductor substrate 12. The plurality of deep trenches 24 constitute an alignment mark 20. The top view of the alignment mark 20 is illustrated in FIG. 8. Preferably, the width W of each deep trench 24 of the alignment mark 20 is smaller than 0.5 microns (small sized), more preferably between 0.2 and 0.3 microns. Since the deep trenches 22 and 24 are formed simultaneously, the depth of the deep trenches 22 and 24 are substantially the same, preferably a depth of about 8000 angstroms, but not limiting thereto.

Figure 3:
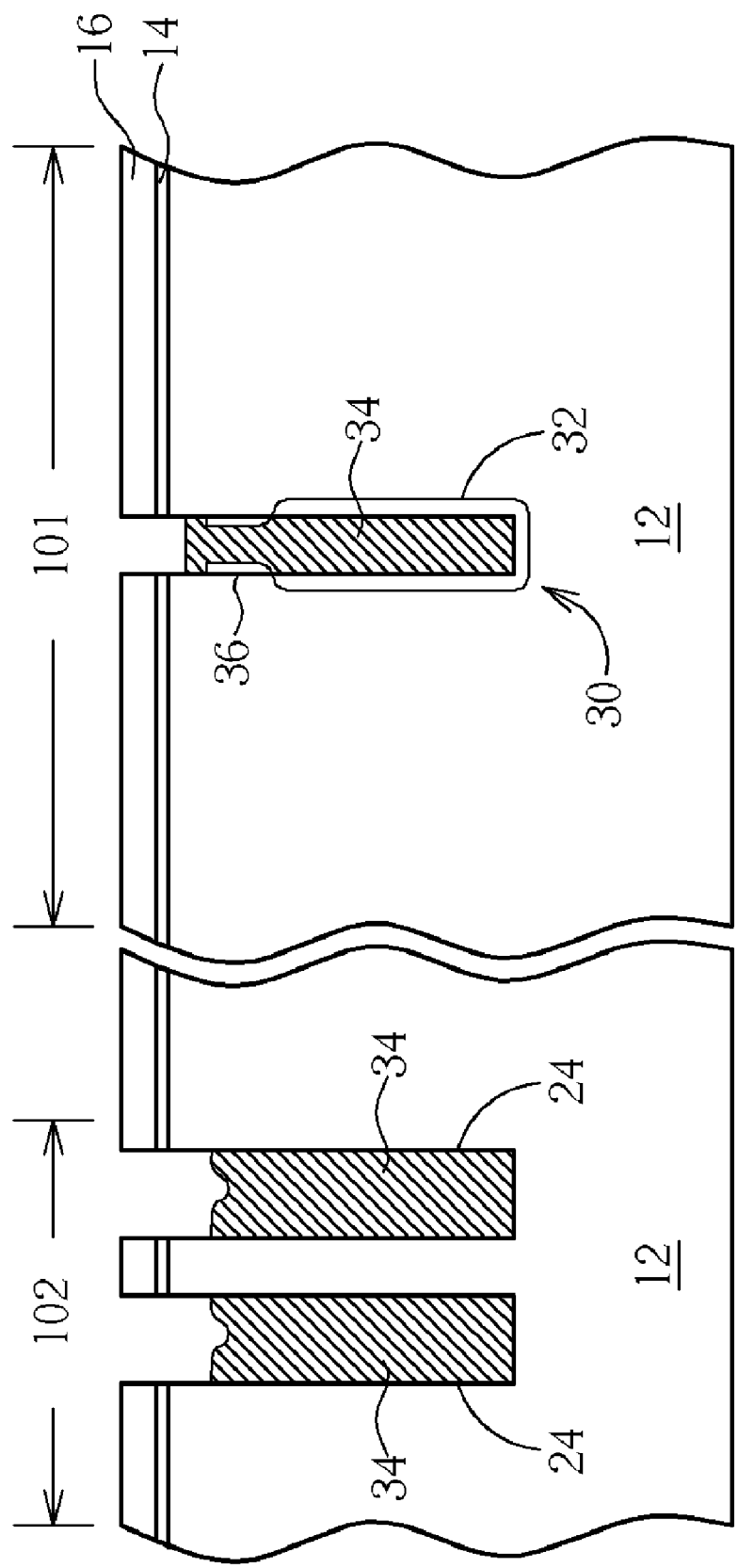

After the formation of deep trenches 22 and 24, a series of deep trench capacitor fabrication processes from Phase 2 to Phase 7 as previously described are performed to form the trench capacitor structure 30 within the device region 101, as depicted in FIG. 3. The trench capacitor structure 30 comprises buried plate electrode 32, polysilicon electrode 34, capacitor dielectric between the buried plate electrode 32 and the polysilicon electrode 34, and collar oxide 36. Simultaneously, layers of polysilicon 34 are deposited into the deep trenches 24 within the alignment mark region 102.

Figure 4:
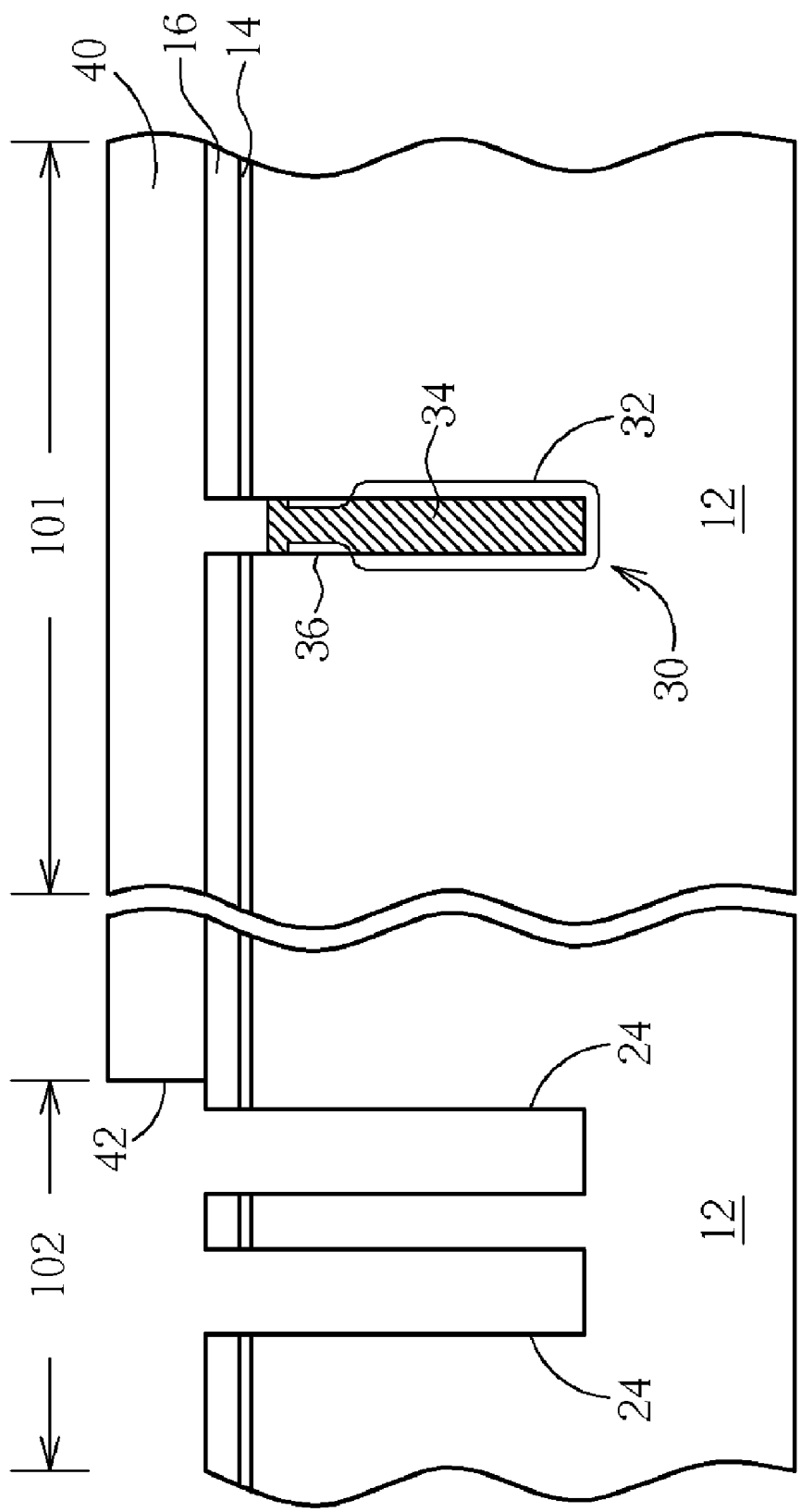

Subsequently, as shown in FIG. 4, a photoresist layer 40 is formed over the semiconductor substrate 12. The photoresist layer 40 masks the device region 101 and has an opening 42 merely exposing the alignment mark region 102. The present invention is characterized in that between the "Mask One" that is employed to define deep trenches of the trench capacitors and the "Mask Two" that is employed to define active area regions and STI regions, an additional mask referring to as "Mask K1" is employed to form the photoresist layer pattern 40 that masks the device region 101 and merely exposes the alignment mark region 102 via the opening 42.

Using the photoresist layer 40 and pad nitride layer 16 as etching hard mask, a dry etching is performed to etch away the polysilicon 34 in the deep trenches 24 exposed via the opening 42. According to the preferred embodiment of this invention, the thickness of the removed polysilicon 34 within the deep trenches 24 ranges between 3000 angstroms and 8000 angstroms.

The dry etching process for cleaning the polysilicon 34 within the exposed deep trenches 24 following the lithographic process employing photoresist layer 40 and Mask K1 are defined as "K1 process". According to the preferred embodiment, the K1 process is utilized to refresh the profile of the deep trenches 24 of the alignment mark 20, such that the alignment accuracy can be improved. After the K1 process, the photoresist layer 40 is stripped.

Figure 5:
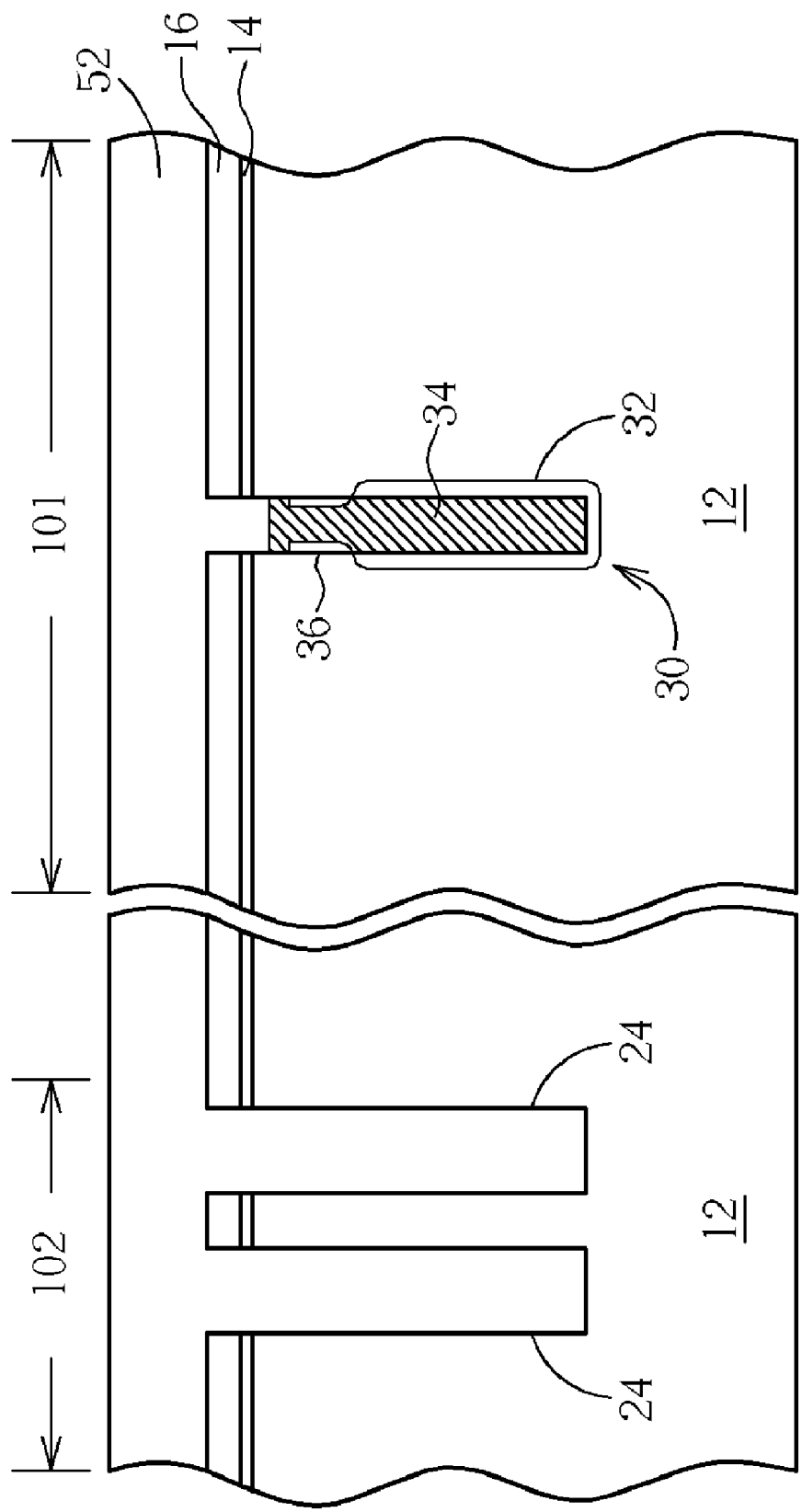

As shown in FIG. 5, a planarization layer 52 such as borosilicate glass (BSG) dielectric or the like. The planarization layer 52 fills the deep trenches 24 in the alignment mark region 102 and recess portions above the trench capacitors 30 in the device region 101.

Figure 6:
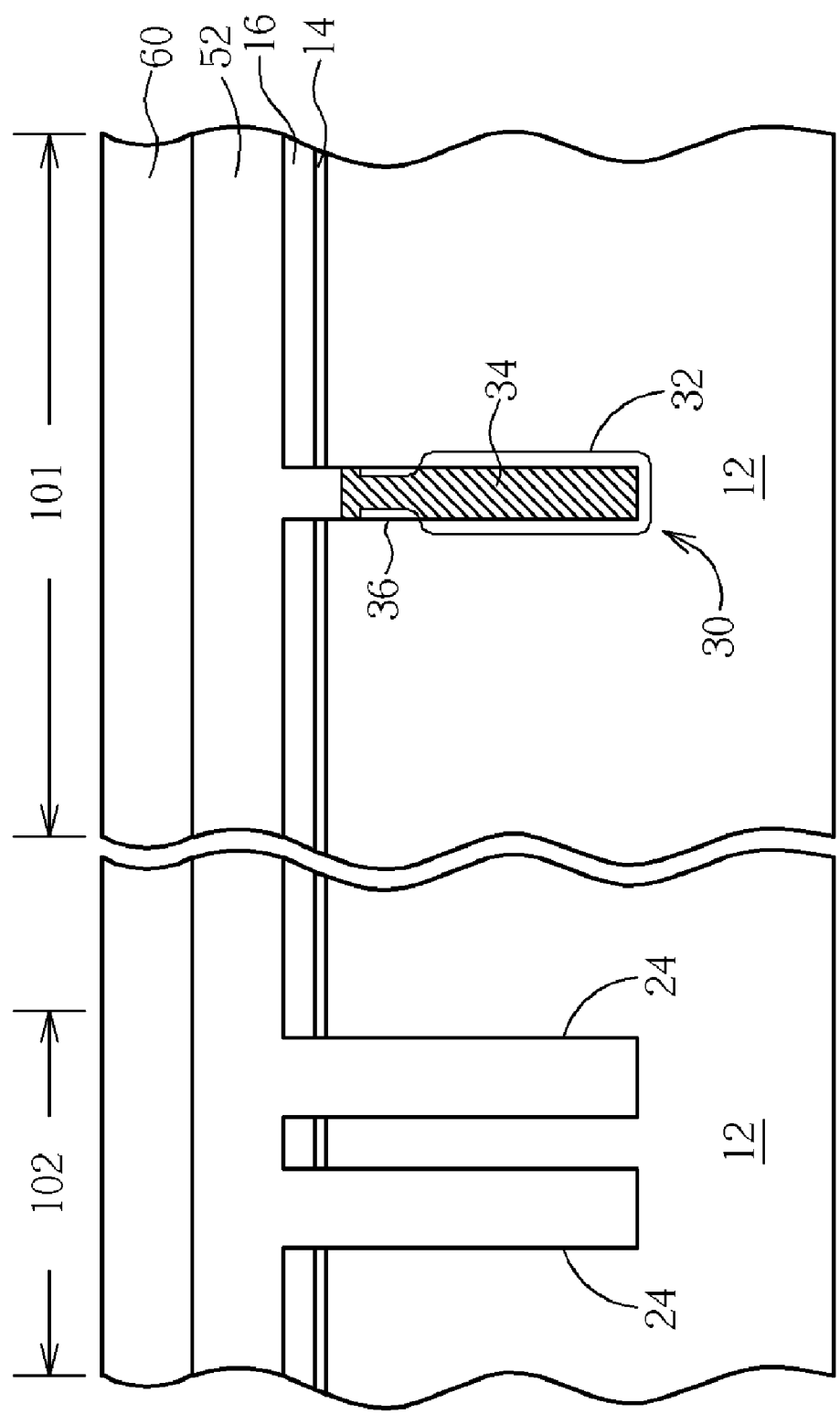

As shown in FIG. 6, a photoresist layer 60 is formed on the planarization layer 52. The photoresist layer 60 is used to define active area regions to be formed on the surface of the semiconductor substrate 12. An alignment device (not shown) of a stepper equipment irradiates a laser beam such He—Ne laser having a pre-selected wavelength such as 635 nm onto the alignment mark region 102 to scan the alignment mark 20 and deep trenches 24. The diffraction light signal is detected to monitor and assess the alignment accuracy of wafer. When the alignment deviation is smaller than specific value for example, 3 sigma <25 nm, the next step, i.e., exposure of the photoresist layer 60 with respect to the Mask Two (AA mask), is carried out. The active area pattern on the Mask Two is then transferred to the photoresis layer 60, which is also referred to as "AA photo". The exposed photoresist layer 60 is then developed using known developer.

Figure 7:
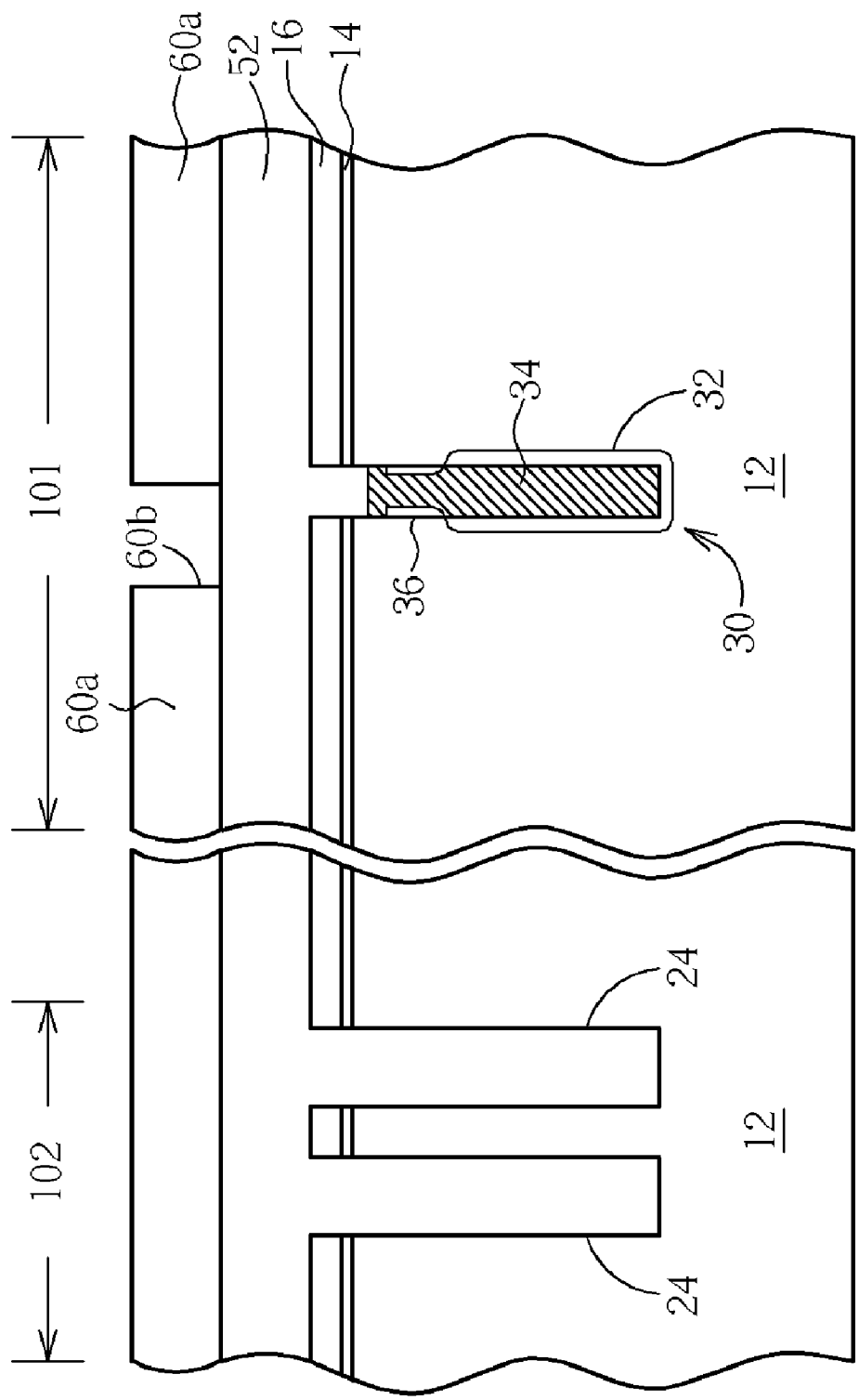

As shown in FIG. 7, the developed photoresist layer comprises active area pattern 60a and opening 60b within the device region 101. The opening 60b, which defines the pattern of shallow trench isolation between the deep trench capacitors, exposes regions to be etched into the semiconductor substrate 12. Subsequently, the conventional shallow trench isolation (STI) process is carried out. The STI process comprises etching the planarization layer 52, pad nitride layer 16, pad oxide layer 14, the semiconductor substrate 12, a portion of the polysilicon electrode 34, a portion of the collar oxide 36, and a portion of the capacitor dielectric via the opening 60b, stripping photoresist layer 60, filling the trench fill dielectric into the shallow trench, and then chemical mechanically polishing the excess trench fill dielectric. The STI process for the deep trench capacitor DRAM device is known in the art, and the details thereof is thus omitted.

Figure 9:
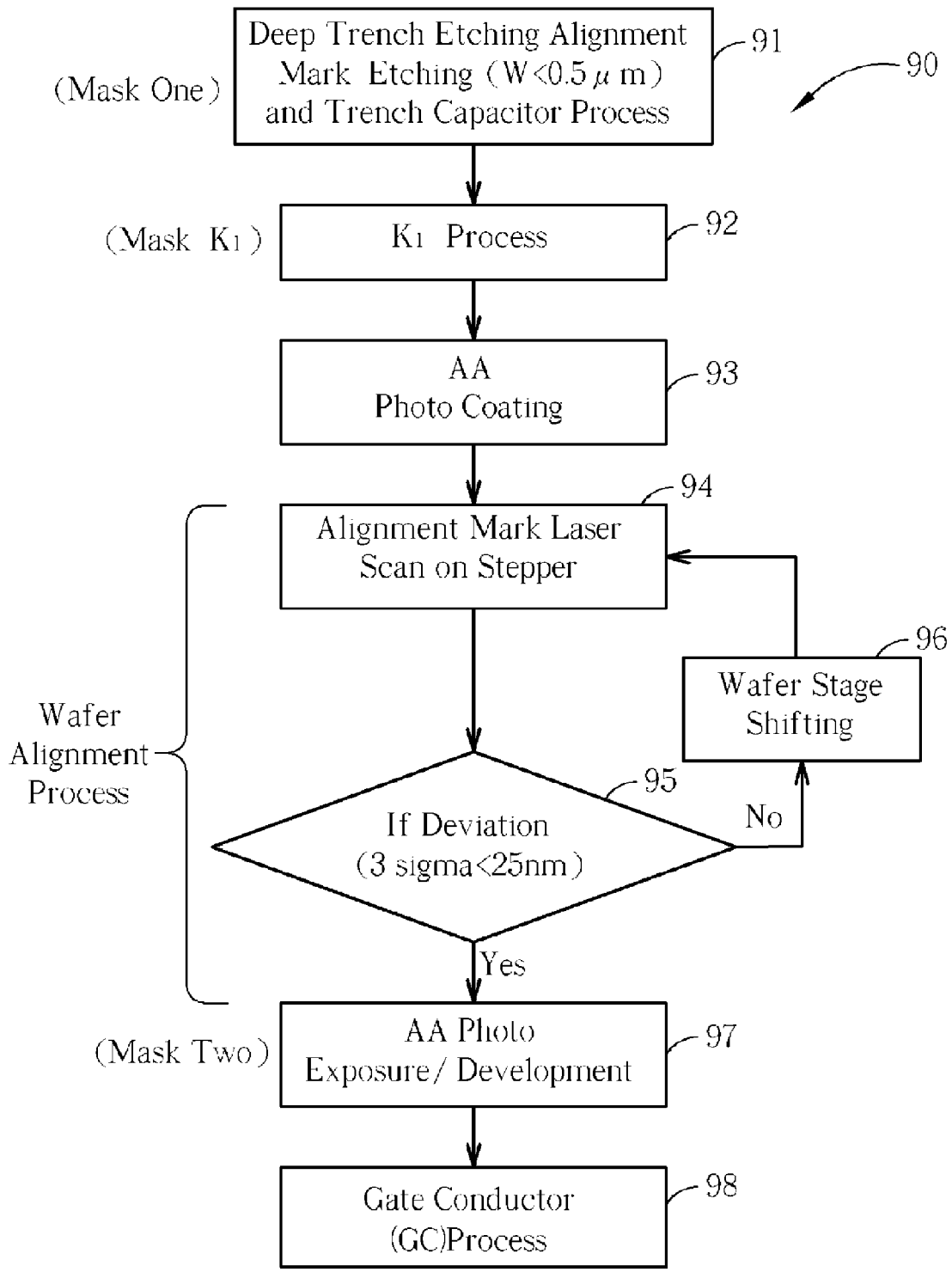
FIG. 9 is a flowchart 90 depicting the method of fabricating deep trench capacitor DRAM device involving the present invention K1 process in accordance with the preferred embodiment of this invention.

Please refer to FIG. 9. FIG. 9 is a flowchart 90 depicting the method of fabricating deep trench capacitor DRAM device involving the present invention K1 process. In Step 91, deep trenches of the trench capacitors and alignment mark are etched. The width W of the deep trenches of the alignment mark is smaller than 0.5 microns. Trench capacitors are formed within the deep trenches in the device region. In Step 92, K1 process is then performed to refresh the profile of the deep trenches of the alignment mark. AA photo is coated on the semiconductor substrate. From Strp 94 to Step 96, wafer alignment process is performed. If the deviation measured by Step 94 exceeds the specific value (25 nm), a feedback signal is transmitted to a control unit of a stepper that will shift the wafer stage to compensate the deviation (Step 96). In Step 97, the AA photo is exposed to light and then developed to form desired mask pattern on the wafer. In Step 98, process of making gate conductor (GC) or word line is carried out.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a microelectronic device, comprising:

providing a semiconductor substrate having thereon a device region and an alignment mark region;

simultaneously etching capacitor trenches into the semiconductor substrate within the device region, and forming alignment mark within the alignment mark region, wherein the alignment mark comprises a plurality of trench lines, and each of the trench lines has a width of smaller than 0.5 microns;

fabricating a trench capacitor within each of the capacitor trenches at least comprising depositing polysilicon layer into the capacitor trenches and simultaneously into the trench lines;

forming a first photoresist layer over the semiconductor substrate, the first photoresist layer having an opening that merely exposing the alignment mark region and the alignment mark;

performing a first etching process to etch the polysilicon layer within the exposed trench lines of the alignment mark;

stripping the first photoresist layer;

forming a second photoresist layer over the semiconductor substrate;

performing a wafer alignment process comprising irradiating the alignment mark using an alignment light beam that passes through the second photoresist layer, thereby acquiring wafer alignment information; and performing an exposure process employing a photomask defining active area pattern thereon, thereby transferring the active area pattern to the second photoresist layer.

2. The method according to claim 1 wherein prior to the step of forming a second photoresist layer over the semiconductor substrate, the method further comprises a step of depositing a planarization layer over the semiconductor substrate.

3. The method according to claim 2 wherein the planarization layer comprises borosilicate glass (BSG) dielectric.

4. The method according to claim 1 wherein a thickness of about 3000-8000 angstroms of the polysilicon within the exposed trench lines of the alignment mark is etched away in the first etching process.

5. The method according to claim 1 wherein each of the trench lines has a width of about 0.2-0.3 microns.

* * * * *